(12) United States Patent
Nakao et al.

(10) Patent No.: US 11,276,988 B2
(45) Date of Patent: Mar. 15, 2022

(54) SEMICONDUCTOR OPTICAL DEVICE

(71) Applicant: Nippon Telegraph and Telephone Corporation, Tokyo (JP)

(72) Inventors: Ryo Nakao, Atsugi (JP); Takaaki Kakitsuka, Atsugi (JP); Shinji Matsuo, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 250 days.

(21) Appl. No.: 16/614,179

(22) PCT Filed: May 15, 2018

(86) PCT No.: PCT/JP2018/018798
§ 371 (c)(1),
(2) Date: Nov. 15, 2019

(87) PCT Pub. No.: WO2018/212195
PCT Pub. Date: Nov. 22, 2018

(65) Prior Publication Data
US 2021/0336412 A1   Oct. 28, 2021

(30) Foreign Application Priority Data
May 15, 2017   (JP) .............................. JP2017-096548

(51) Int. Cl.
*H01S 5/22*  (2006.01)
*H01S 5/042*  (2006.01)

(52) U.S. Cl.
CPC .............. *H01S 5/222* (2013.01); *H01S 5/042* (2013.01)

(58) Field of Classification Search
CPC ................................. H01S 5/222; H01S 5/042
See application file for complete search history.

(56) References Cited

U.S. PATENT DOCUMENTS

2012/0320939 A1*  12/2012  Baets .................... H01S 5/1032
                                                                 372/45.01

FOREIGN PATENT DOCUMENTS

| JP | 2012-33729 A | | 2/2012 | |
|----|--------------|---|--------|---|
| JP | 2015015396 A | * | 1/2015 | ............... H01S 5/20 |
| JP | 2016-171173 A | | 9/2016 | |

OTHER PUBLICATIONS

Machine translation of JP2015-15396A (Year: 2015).*
International Search Report dated Aug. 14, 2018, issued in PCT Application No. PCT/JP2018/018798, filed May 15, 2018.
Written Opinion dated Aug. 14, 2018, issued in PCT Application No. PCT/JP2018/018798, filed May 15, 2018.

(Continued)

*Primary Examiner* — Yuanda Zhang
(74) *Attorney, Agent, or Firm* — Workman Nydegger

(57) ABSTRACT

A semiconductor optical device that achieves both of heat dissipation and light confinement and permits efficient current injection or application of an electric field is implemented. The semiconductor optical device includes: a core layer including an active region (1) made of a compound semiconductor; two cladding layers (5, 6) injecting current into the core layer; and a third cladding layer (4) made of a material having a larger thermal conductivity, a smaller refractive index, and a larger band gap than a material for any of the core layer and the two cladding layers.

9 Claims, 19 Drawing Sheets

(56) References Cited

OTHER PUBLICATIONS

International Preliminary Report on Patentability dated Nov. 28, 2019, issued in PCT Application No. PCT/JP2018/018798, filed May 15, 2018.
Wataru Kobayashi et al., *50-GB/s Direct Modulation of a 1.3-μm InGaAlAs-Based DFB Laser with a Ridge Waveguide Structure*, IEEE Journal of Selected Topics in Quantum Electronics, vol. 19, No. 4, Jul./Aug. 2013, pp. 1500908-1500908.
Takuro Fujii et al., *Epitaxial Growth of InP to Bury directly Bonded Thin Active Layer on $SiO_2$/Si Substrate for Fabricating Distributed Feedback Lasers on Silicon*, IET Optoelectronics, vol. 9, No. 4, Aug. 2015, pp. 151-157.
Shinji Tsuji et al., *InGaAsP/InP Laser Diodes Mounted on Semi-Insulating SiC Ceramics*, Japanese Journal of Applied Physics, vol. 22, No. SL 22-1, Jan. 1983, pp. 239-242.
Jesus A. del Alamo et al., *Rapid Thermal Annealing of InP Using GaAs and InP Proximity Caps*, Published by the American Institute of Physics, J. Appl. Phys., vol. 62, 1987, pp. 3456-3458.

\* cited by examiner

|  | THERMAL CONDUCTIVITY (×10⁻⁶ W/m) | REFRACTIVE INDEX @1.31μm |
|---|---|---|
| InP | 62 | 3.2020 |
| Si | 130 | 3.5008 |
| SiC | 490 | 2.5731 |
| InGaAlAs (WELL) | 44 | 3.5182 |
| InGaAlAs (BARRIER) | 4 | 3.3830 |
| SiO₂ | 1 | 1.4468 |
| AIR | 0.0241 | 1 |

FIG.5

SEMICONDUCTOR OPTICAL DEVICE

TECHNICAL FIELD

The present invention relates to a semiconductor optical device, and more particularly to a semiconductor optical device having a semiconductor structure which achieves both of high thermal conductivity and high optical confinement by using a cladding of a high thermal conductivity, a high band gap and a low refractive index.

BACKGROUND ART

Semiconductor devices are widely used as small-sized, low-power-consuming electronic elements (electronic devices). In particular, semiconductor optical devices including semiconductor lasers that perform light emission, light reception, light modulation and the like are important components that constitute an optical information communication system.

In the optical information communication system, a direct transition type compound semiconductor such as InP (indium phosphorus) or GaAs (gallium arsenide) is mainly used as a material for a semiconductor optical device from the viewpoint of light emission. However, materials such as InP and GaAs cannot be said to have a good thermal conductivity, and the characteristics have been limited by a temperature rise due to heat generation during operation of the device (for example, Non-Patent Literature 1).

On the other hand, although Si (silicon), which is widely used as a material for semiconductor devices, has a higher thermal conductivity than compound semiconductors such as InP and GaAs, Si is an indirect transition type semiconductor, so that it is very difficult to use Si as a material for the active layer of a light emitting device.

Further, Si has a refractive index higher than that of InP and GaAs, and cannot be used for a cladding layer from the viewpoint of light confinement. Si needs to be placed at a sufficient distance apart from the active layer (core) material composed of InP, GaAs, or the like via other cladding materials having a lower (smaller) refractive index, which also makes it difficult to improve the heat dissipation of the semiconductor optical device by using Si.

Furthermore, in the case of InP-based semiconductor optical devices, the difference in refractive index between the active layer (core) material (InGaAsP, InGaAlAs or the like) necessary for light confinement and the cladding material (InP or the like) cannot be set large. As a result, the improvement of the device characteristics by using Si are limited.

As a measure to increase the difference in refractive index between the core and the cladding of an InP-based semiconductor optical device, semiconductor lasers that use air or an insulating film (for example, a $SiO_2$ film formed on a Si substrate) with a small (low) refractive index as a cladding material have been proposed (for example, Non Patent Literature 2). In this conventional example, the device characteristics are greatly improved in the region where the current injection is small, that is, the temperature rise is small.

However, in a case where an insulating material such as air or an insulating film is used for a cladding material, the heat conduction characteristic is deteriorated, so that the temperature rise of the device become greater, resulting in notable heat-based deterioration of characteristics.

Furthermore, in this structure, the difference in thermal expansion coefficient between InP, which is the main material for a core layer, and Si, which is the substrate material, limits the rising temperature in the temperature rising process of the manufacturing process.

A metal material is also considered as a material having a high thermal conductivity. For example, Au (gold) has a thermal conductivity higher than that of Si, and the real part of the complex refractive index is also small at the wavelength used for optical communication. However, since the absorption loss of light is large due to a large imaginary part of the complex refractive index, light confinement in the optical waveguide cannot be achieved, so that the material is not suitable for use as a cladding material. It is necessary to use, as a cladding material, a material having a small imaginary part (absorption loss of light) in the complex refractive index at the operating wavelength of the optical element.

Furthermore, there is also a problem such that in a semiconductor optical device in which a current is injected, or an electric field is applied to the semiconductor optical device formed on the substrate in a direction parallel to the substrate surface, a conductive material such as metal acts to cause carriers necessary for operation to escape or bypass, so that current injection and application of an electric field cannot be performed. In order for a cladding material to appropriately permit current injection or application of an electric field to the semiconductor optical device, the cladding material needs to have a band gap larger than those of the core layer and p-type and n-type semiconductor layers, and acts as a barrier for the semiconductor carriers in the semiconductor optical device.

Due to these problems, the structure of a semiconductor optical device that achieves both of light confinement and a high thermal conductivity and efficiently enables current injection or application of an electric field to the active layer of the semiconductor optical device has not been implemented so far.

On the other hand, attempts have been made to use SiC (silicon carbide) as material of substrate having a large thermal conductivity, and mount a semiconductor optical device chip on the substrate to improve heat dissipation (Non Patent Literature 3). However, Non Patent Literature 3 has a structure in which a pre manufactured laser chip is merely mounted on the SiC substrate, so that the structure is not designed for a material having a low refractive index and good heat dissipation to be used for light confinement in the vertical direction of the substrate. That is, Non Patent Literature 3 has a problem such that InP is adopted as a lower cladding material of the semiconductor optical device chip, and the difference in refractive index between the active layer and the core layer and the cladding layer is not large, so that the light confinement factor cannot be increased.

As described above, materials for improving heat dissipation and materials for achieving light confinement have been studied separately so far, but the optical properties of the materials for improving heat dissipation have not been taken into consideration. The electrical characteristics have not been taken into consideration either.

CITATION LIST

Non Patent Literatures

NPL 1: W. Kobayashi, T. Ito, T. Yamanaka, T. Fujisawa, Y. Shibata, T. Kurosaki, M. Kohtoku, T. Tadokoro, and H. Sanjoh, "50-Gb/s direct modulation of a 1.3-μm InGaAlAs-based DFB laser with a ridge waveguide structure", IEEE J. Sel. Top. Quantum Electron., vol. 19, no. 4, pp. 1500908-1500908, July 2013. [0015-2]

NPL 2: T. Fujii, T. Sato, K. Takeda, K. Hasebe, T Kakitsuka, and S. Matsuo, "Epitaxial growth of InP to bury directly bonded thin active layer on SiO$_2$/Si substrate for fabricating distributed feedback lasers on silicon", IET Optoelectron., vol. 9, no. 4, pp. 151-157, August 2015. [0015-3]

NPL 3: S. Tsuji, K. Mizuishi, Y. Nakayama, M. Shimaoka, and M. Hirao, "InGaAsP/InP Laser Diodes Mounted on Semi-Insulating SiC Ceramics", Jpn. J. Appl. Phys., vol. 22, no. 51, p. 239, January 1983. [0015-4]

NPL 4: J. A. Alamo, T. Mizutani, "Rapid thermal annealing of InP using GaAs and InP proximity caps", Published by the American Institute of Physics, J. Appl. Phys., vol. 62, pp. 3456-3458, 1987.

SUMMARY OF INVENTION

Technical Problem

It is essential to operate the semiconductor laser on a high injection current (high injection current operation) in order to increase the output of the semiconductor laser and to speed up direct modulation, but the operating current is limited due to heat generated by Joule heating, so that materials having a high thermal conductivity are required. Further, although it is effective to increase light confinement for a low threshold current operation and enhancement of direct modulation efficiency, semiconductor optical devices using compound semiconductor materials such as InP and GaAs that have been used conventionally have a difficulty in achieving both of high light confinement and high heat conduction.

Furthermore, there also is a problem such that in a device in which different materials such as InP and Si are integrated, a difference in thermal expansion coefficient between the different materials causes thermal stress due to the difference in thermal expansion between the materials in the temperature rising process of the manufacturing process, thereby producing defects in the semiconductor optical device.

The present invention has been made to solve such problems, and is directed to realizing a high-performance optical device by selecting the material for a cladding layer formed adjacent to the core layer of the semiconductor optical device or via a thin insulating film so as to have a higher thermal conductivity, a smaller refractive index and a greater band gap than those of the materials for forming an active layer and a core layer of the optical device, and n-type and p-type semiconductor layers, and to have about a same thermal expansion coefficient as the material for the core layer.

Solution to Problem

The present invention is characterized by having the following configuration in order to achieve such an objective.

A semiconductor optical device according to an embodiment of the present invention includes:
  a first core layer including an active region made of a compound semiconductor;
  a first cladding layer made of a p-type semiconductor and a second cladding layer made of an n-type semiconductor, the first cladding layer and the second cladding layer sandwiching the first core layer; and
  a third cladding layer disposed under the first core layer, the first cladding layer, and the second cladding layer, wherein
  the third cladding layer is made of a material having:
  a thermal conductivity greater than that of any of the first core layer, the first cladding layer, and the second cladding layer;
  a refractive index smaller than that of any of the first core layer, the first cladding layer, and the second cladding layer; and
  a band gap larger than that of any of the first core layer, the first cladding layer, and the second cladding layer.

The semiconductor optical device according to another embodiment of the present invention is characterized in that the third cladding layer is made of one type of material.

The semiconductor optical device according to another embodiment of the present invention is characterized in that the material forming the third cladding layer includes at least one of SiC (silicon carbide), GaN (gallium nitride), C (diamond), AlN (aluminum nitride), BN (boron nitride).

The semiconductor optical device according to another embodiment of the present invention is characterized in that a thickness t of the first core layer satisfies the following relationship:

$$t < \frac{3}{2\pi} \frac{\lambda}{\sqrt{n_{core}^2 - n_{clad}^2}}$$

where an operating wavelength of light is $\lambda$, an average refractive index of the first core layer is $n_{core}$, and the refractive index of the material for the third cladding layer is $n_{clad}$.

The semiconductor optical device according to another embodiment of the present invention is characterized in that the third cladding layer is made of at least two different kinds of materials.

The semiconductor optical device according to another embodiment of the present invention is characterized in that one of the two types of materials forming the third cladding layer is a semiconductor having a large thermal conductivity, and an other of the materials is an insulating material having a small refractive index and a large band gap.

The semiconductor optical device according to another embodiment of the present invention is characterized in that a thickness of the layer of the insulating material is defined to such an extent that light is confined in a core, but a heat radiation effect is obtained.

The semiconductor optical device according to another embodiment of the present invention is characterized in that a second core layer is inserted in the third cladding layer, and the first core layer and the second core layer are optically coupled.

The semiconductor optical device according to another embodiment of the present invention is characterized in that the first core layer is sandwiched between the first cladding layer and the second cladding layer and is disposed along a surface of the third cladding layer, and
  a direction of an injection current to the first core layer is substantially parallel to the surface of the third cladding layer.

The semiconductor optical device according to another embodiment of the present invention is characterized in that the first core layer is sandwiched between the first cladding layer and the second cladding layer and is disposed perpendicular to a surface of the third cladding layer, and a direction of an injection current to the first core layer is perpendicular to the surface of the third cladding layer.

Advantageous Effects of Invention

According to the aforementioned structure of the semiconductor optical device according to the present invention, it is possible to realize a semiconductor optical device capable of efficiently injecting a current or applying an electric field while achieving both of heat dissipation and light confinement. It is also possible to achieve a structure that can withstand high temperature processing.

BRIEF DESCRIPTION OF DRAWINGS

FIG. 5 is a table of thermal conductivities and refractive indexes of the materials of the present invention and the comparative example;

DESCRIPTION OF EMBODIMENTS

The following describes in detail embodiments of the present invention with reference to the accompanying drawings.

Figure 1:
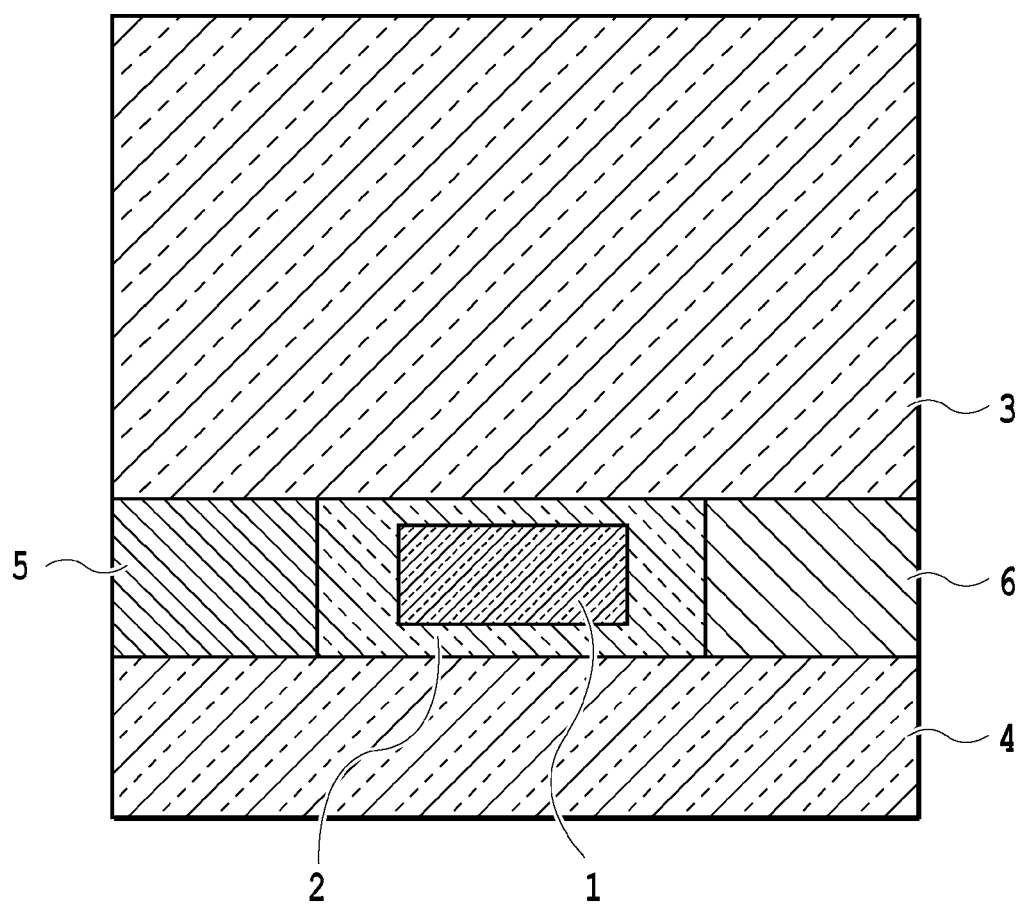
FIG. 1 is a schematic cross-sectional view of a semiconductor optical device of the present invention.

FIG. 1 is a schematic cross-sectional view of a semiconductor optical device according to an embodiment of the present invention. As shown in FIG. 1, the semiconductor optical device of the present invention has a core layer (first core layer) in which a semiconductor active layer (active region) 1 made of a compound semiconductor is embedded with optical semiconductor layers 2. A material having a smaller refractive index, a higher thermal conductivity, and a larger band gap than the core layer material is used as a material for at least one of an upper cladding layer 3 or a lower cladding layer 4 (third cladding layer, substrate), which are sandwiching the first core layer. Further, as a structure permitting current injection or application of an electric field in a direction substantially parallel along the upper cladding layer 3 or the lower cladding layer 4, a p-type semiconductor layer (first cladding layer) 5 and an n-type semiconductor layer (second cladding layer) 6, which horizontally sandwich the first core layer in contact with the first core layer are provided.

Example 1

Figure 2:
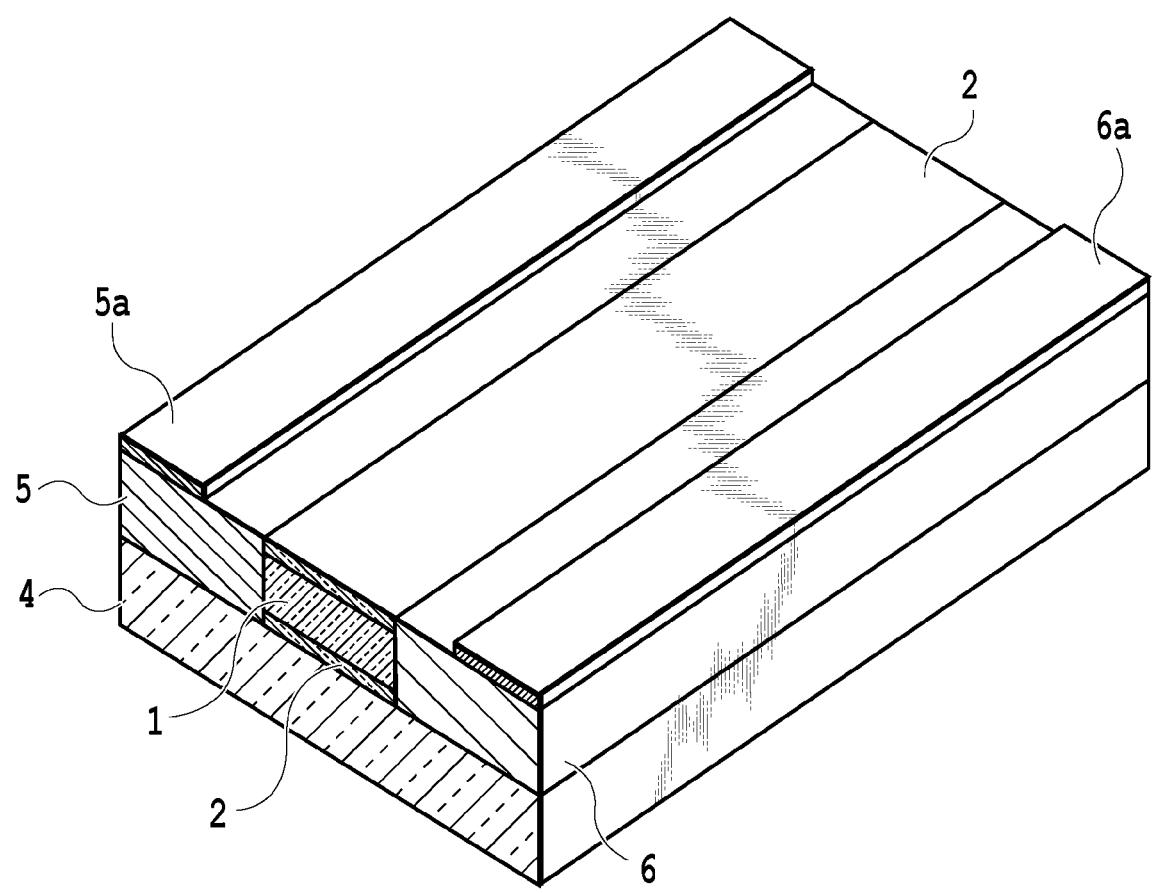
FIG. 2 is a perspective view showing the structure of a semiconductor optical device of Example 1 of the present invention.

FIG. 2 is a perspective view showing the structure of the semiconductor optical device according to Example 1 of the present invention. Example 1 of the present invention has a semiconductor laser structure in which current is injected approximately in parallel along the surface of the substrate from the cladding layer 5 to the cladding layer 6 with the active layer 1 sandwiched therebetween as shown in FIG. 2.

In FIG. 2, the active layer 1 is formed of, for example, InGaAlAs having different compositions as quantum well (MQW) and barrier layer materials, and the core layer (first core layer) is formed by embedding the active layer 1 vertically with the upper and lower optical semiconductor layers 2 (for example, i-InP). The p-type semiconductor layer (p-InP, first cladding layer) 5 and the n-type semiconductor layer (n-InP, second cladding layer) 6 are formed with the core layer sandwiched therebetween, and a contact layer and electrodes 5a and 6a are provided to inject a drive current into the active layer 1 substantially in parallel along the substrate surface.

The active layer 1, the optical semiconductor layers 2, and the cladding layers 5 and 6 can be made of, for example, at least one or more of InP, GaAs, AlAs, GaP, GaN, and compounds thereof.

SiC is used as the material for the lower cladding layer 4 (third cladding layer, supporting substrate) which serves as a supporting substrate of these layers has a smaller refractive index, a higher thermal conductivity, and a larger band gap than the material for the core layer.

The material for the lower cladding layer 4 is not limited to SiC, and is neither limited to one type, and a material having a lower refractive index, a larger thermal conductivity and a larger band gap than the material for any one of the core layer and the cladding layers 5 and 6 may be used. The cladding layer 4 can be formed of a single layer of or a laminated structure of, for example, GaN (gallium nitride), C (diamond), AlN (aluminum nitride), BN (boron nitride) and the like in addition to SiC. The upper cladding layer 3 can be formed by, for example, an air layer, and is not shown in FIG. 2 and the subsequent diagrams.

In Example 1 of FIG. 2, the width of the active layer 1 in which the multiple quantum well is formed is 0.6 the thicknesses of the p-type and n-type semiconductor layers 5 and 6, and the thickness of the combined layer (core layer) of the active layer 1 and the upper and lower optical semiconductor layers 2 are each 0.301 μm. The thickness of the core layer is approximately an upper limit at which light of a wavelength of 1.31 μm propagating in the core layer becomes a single mode in the thicknesswise direction of the core layer.

In a case where the operating wavelength or the material to be used is changed, there is a condition for the propagating light to be in a single mode with respect to the thickness of the core layer. Given that the operating wavelength is λ, the average refractive index of the core is $n_{core}$, and the refractive index of that layer in the cladding layess which is used for heat dissipation and light confinement is $n_{clad}$, this condition is such that the thickness t of the core layer approximately satisfies the relationship of the following Equation (1).

$$t < \frac{3}{2\pi} \frac{\lambda}{\sqrt{n_{core}^2 - n_{clad}^2}} \quad (1)$$

For example, for use in the 1.55 μm band, the thickness t of the core layer is 0.364 μm or less.

In this structure, the active layer made of InP and InGaAlAs can be formed by crystal growth technology, and the cladding layer of SiC can be formed by technology of bonding the substrate to the active layer, or the like. However, the fabrication method is not limited to this type. In addition, although light confinement in the horizontal direction of the substrate is implemented by the difference between the refractive indexes of the multiple quantum well and the p-InP and n-InP and the waveguide gain, light confinement can be implemented by a two-dimensional photonic crystal structure or the like, and the implementation method is not limited.

Figure 3:
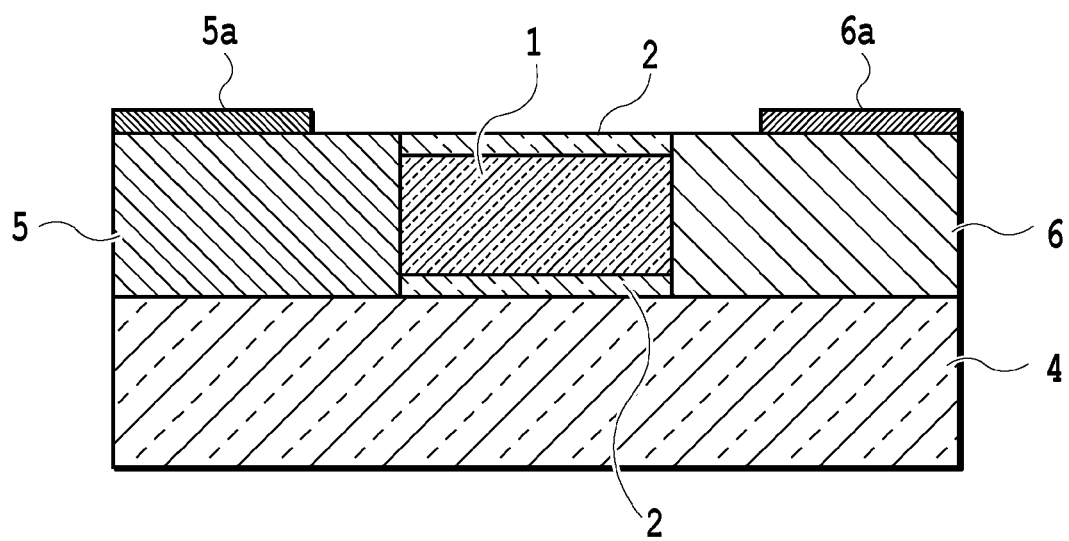
FIG. 3 is a cross-sectional structural diagram of Example 1 of the present invention.

FIG. 3 is a cross-sectional view of Example 1 of FIG. 2.

Figure 4:
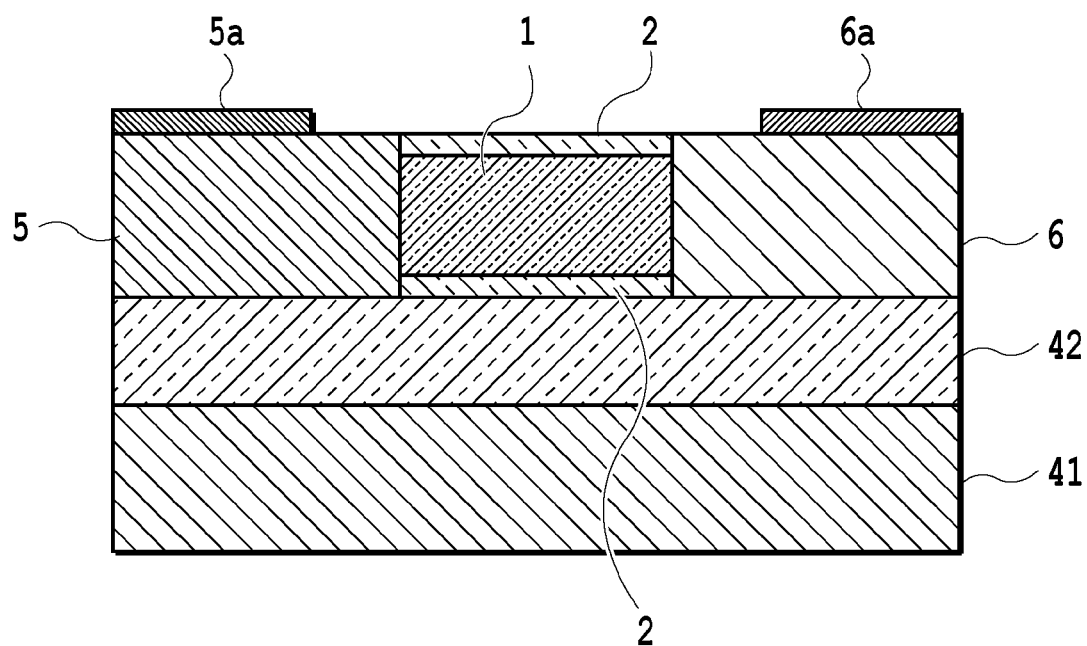
FIG. 4 is a cross-sectional structural diagram of a semiconductor optical device examined as a comparative example.

FIG. 4 is a cross-sectional structural view of a comparative example examined for comparison with Example 1 of FIG. 3. The comparative example of FIG. 4 is a semiconductor optical device (laser) in which the active layer 1, the optical semiconductor layers 2, and the cladding layers 5 and 6 of p and n-type semiconductors like those of Example 1 are formed on the two-layer structure of a Si substrate 41 and a SiO$_2$ layer 42.

Since the refractive index of Si is larger than the average refractive index of the materials for the active layer and the core layer, light cannot be confined in the active layer in a case where the active layer 1 and the Si substrate 41 are formed in direct contact with each other. Therefore, the comparative example of FIG. 4, as described in the NPL 2, adopts the two-layer substrate structure in which a SiO$_2$ layer 42 having a low refractive index is formed between the active layer 1 and the Si substrate 41.

In the analysis of Example 1 and the comparative example which is described below, the operating wavelength of the semiconductor laser is set to 1.31 μm.

FIG. 5 is a table of thermal conductivities and refractive indexes of various materials used in the calculation in the present invention and the comparative example. It is understood from the table of FIG. 5 that the thermal conductivity of SiC is overwhelmingly large compared to those of all other materials, and the refractive index of SiC at a wavelength of 1.31 μm is smaller compared to those of compound semiconductor materials serving as other cores. Therefore, it can be understood that SiC has an appropriate value as the lower cladding and the substrate that enable light confinement and provide heat dissipation. Although not shown in the table of FIG. 5, while the band gaps of InP and GaAs are less than 2 eV, the band gap of SiC is about 3 eV; SiC is larger in band gap and acts as a barrier to carriers.

Figure 6:
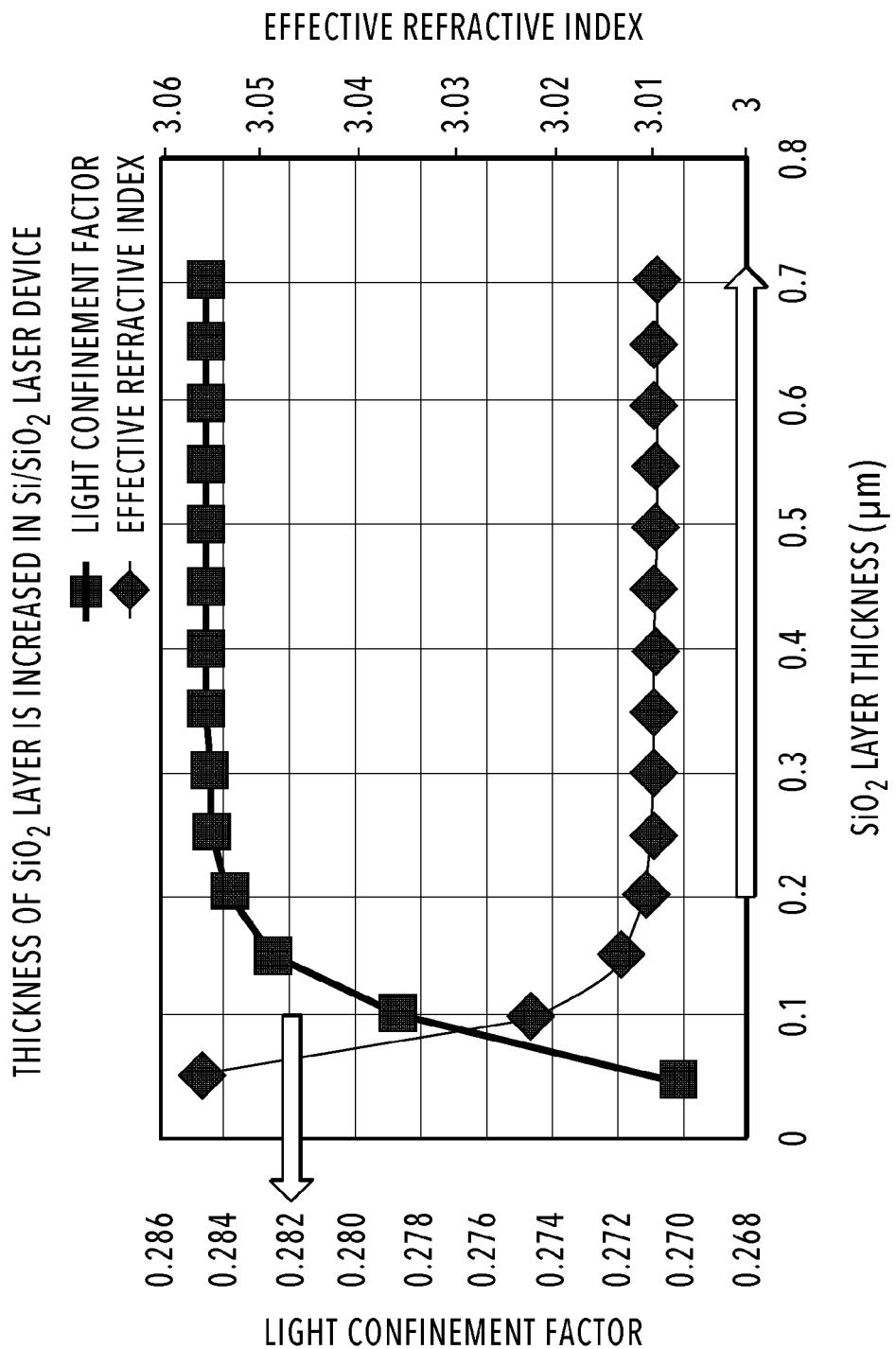
FIG. 6 is a diagram showing a relationship among the thickness of a $SiO_2$ film, a light confinement factor and an effective refractive index in the comparative example of FIG. 4.

FIG. 6 is a diagram (graph) showing the relationship between the light confinement factor to the quantum well (LIGHT CONFINEMENT FACTOR on the left vertical axis) and the effective refractive index (EFFECTIVE REFRACTIVE INDEX on the right vertical axis) in a case where the thickness of a SiO$_2$ film (SiO$_2$ LAYER THICKNESS, horizontal axis) is increased in the laser device of the comparative example of FIG. 4 in which the substrate material is Si and the cladding material is SiO$_2$. It can be seen from FIG. 6 that the light confinement factor and the effective refractive index show constant values when the thickness of the SiO$_2$ film is 0.3 μm or larger, but the light confinement factor decreases in a case where the thickness of the SiO$_2$ film is smaller than 0.3 The decrease in the light confinement factor means that light leaks to the side of the Si substrate 41 which is not suitable for light confinement in the case where the thickness of the SiO$_2$ layer 42 is smaller than 0.3 Therefore, it can be seen that in order to form a semiconductor laser on the Si substrate 41, the thickness of the SiO$_2$ layer 42 of at least 0.3 μm or more is necessary. As a result, in the comparative example of FIG. 4, it is difficult to secure sufficient heat dissipation.

Figure 7:
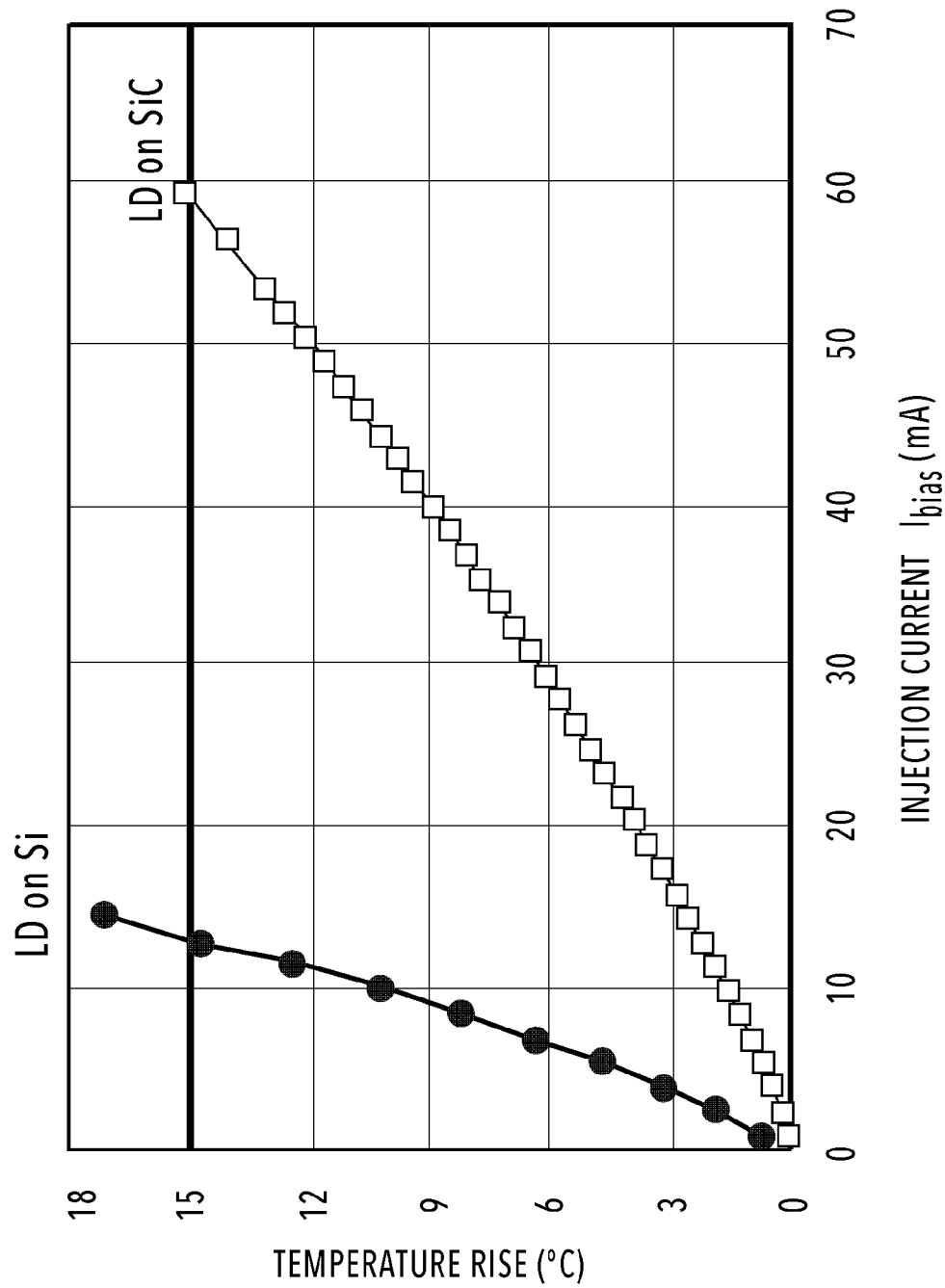
FIG. 7 is a diagram of two graphs showing a relationship between an injection current and a temperature rise in Example 1 of the present invention and the comparative example.

FIG. 7 is a diagram of two graphs showing the relationship between the injection current (horizontal axis, INJECTION CURRENT) and temperature rise (vertical axis, TEMPERATURE RISE) for Example 1 of FIG. 3 (LD on SiC) in comparison with the comparative example of FIG. 4 (LD on Si). Assuming that the temperature rise allowed for the semiconductor laser is 15° C., injectable current is about 59 mA in a case of the laser being formed on the SiC substrate 4 according to Example 1, whereas for the laser being formed on the Si substrate 41 as in the comparative example, injectable current is about 13 mA. It can be seen that under the same temperature conditions, Example 1 allows for injection of high current which is four times or more than what is allowed by the comparative example.

Figure 8:
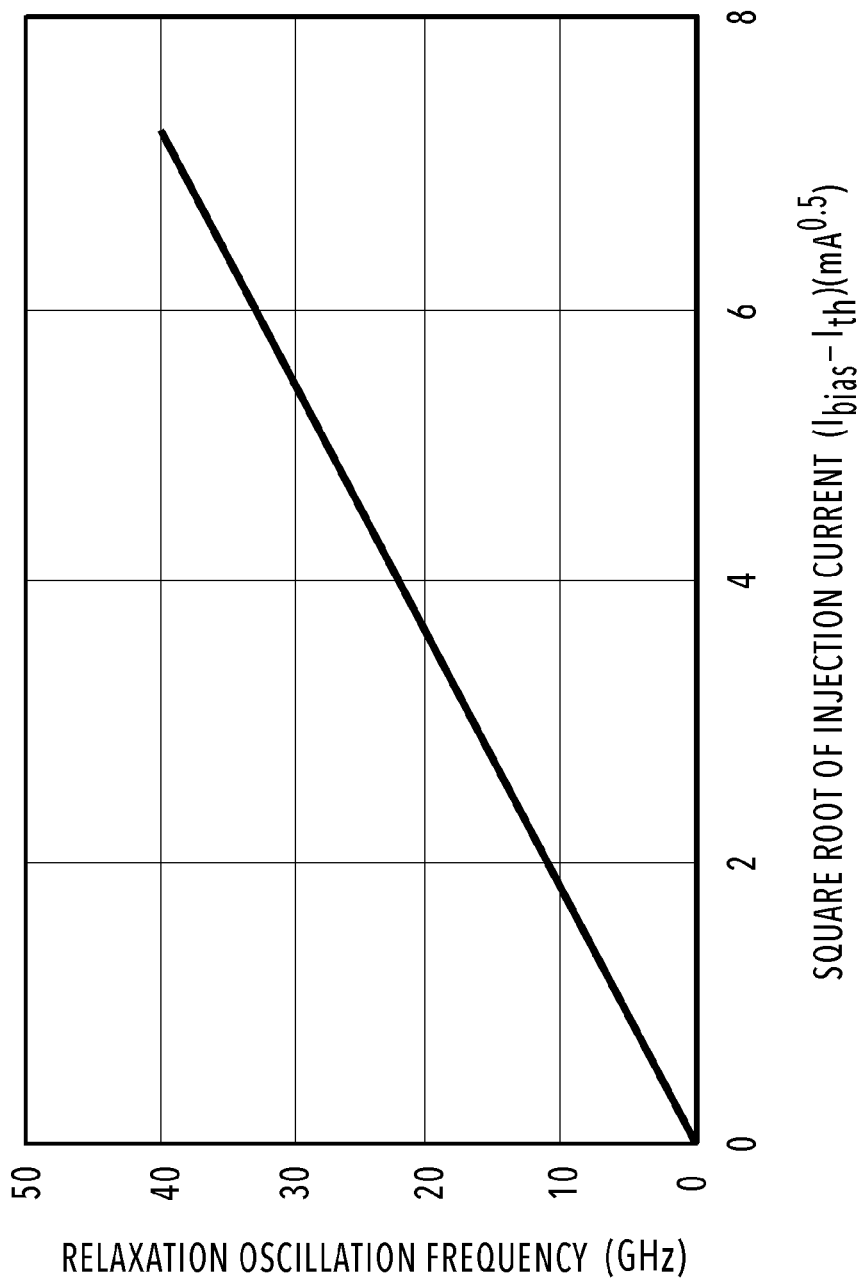
FIG. 8 is a diagram showing a relationship between an injection current and a relaxation oscillation frequency in Example 1 of the present invention.
Figure 9:
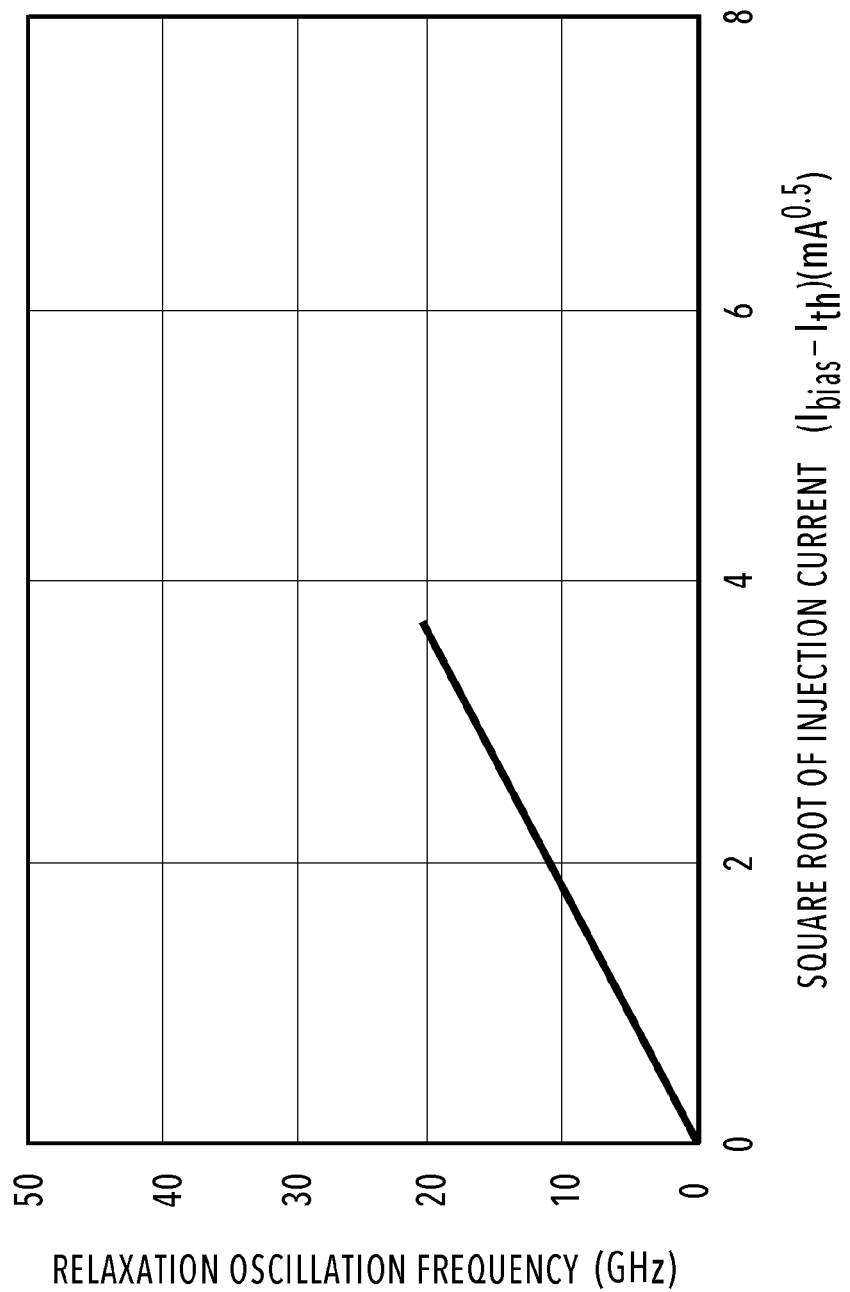
FIG. 9 is a diagram showing a relationship between an injection current and a relaxation oscillation frequency in the comparative example.

FIGS. 8 and 9 are two diagrams showing the relationships between the relaxation oscillation frequency (vertical axis, RELAXATION OSCILLATION FREQUENCY), which is one of the important characteristics of the semiconductor laser, and the square root of the injection current (horizontal axis, SQUARE ROOT OF INJECTION CURRENT) in Example 1 and the comparative example. FIG. 8 shows a graph for Example 1 of FIG. 3, and FIG. 9 shows a graph for the comparative example of FIG. 4. The ranges to the values of the abscissa corresponding to the injection currents resulting in the allowed temperature rise evaluated in FIG. 7 are respectively plotted. As shown in FIG. 8, in the case of the laser formed on the SiC substrate 4 according to Example 1, the relaxation oscillation frequency reaches about 40 GHz. On the other hand, as shown in FIG. 9, in the case of the laser formed on the Si substrate 41 as in the comparative example, the relaxation oscillation frequency remains at about 20

GHz. It can be seen that the operation of Example 1 is twice as fast as that of the comparative example.

In Example 1, the multiple quantum well structure (MQW) formed by using InP and InGaAlAs as the core material for the active layer 1 and the optical semiconductor layers 2 is provided, but the material for and the structure of the active layer are not limited to those. The materials for the active layer 1, the optical semiconductor layers 2, and the cladding layers 5 and 6, as described above, can be made of at least one or more of InP, GaAs, AlAs, GaP, GaN, and compounds thereof.

Evaluation of Thermal Stress Strain in Manufacturing Process

A problem such that the difference in thermal expansion coefficient between different materials constituting the semiconductor optical device causes a thermal stress in the temperature rising process of the manufacturing process, producing defects in the semiconductor optical device will be considered.

Figure 10:
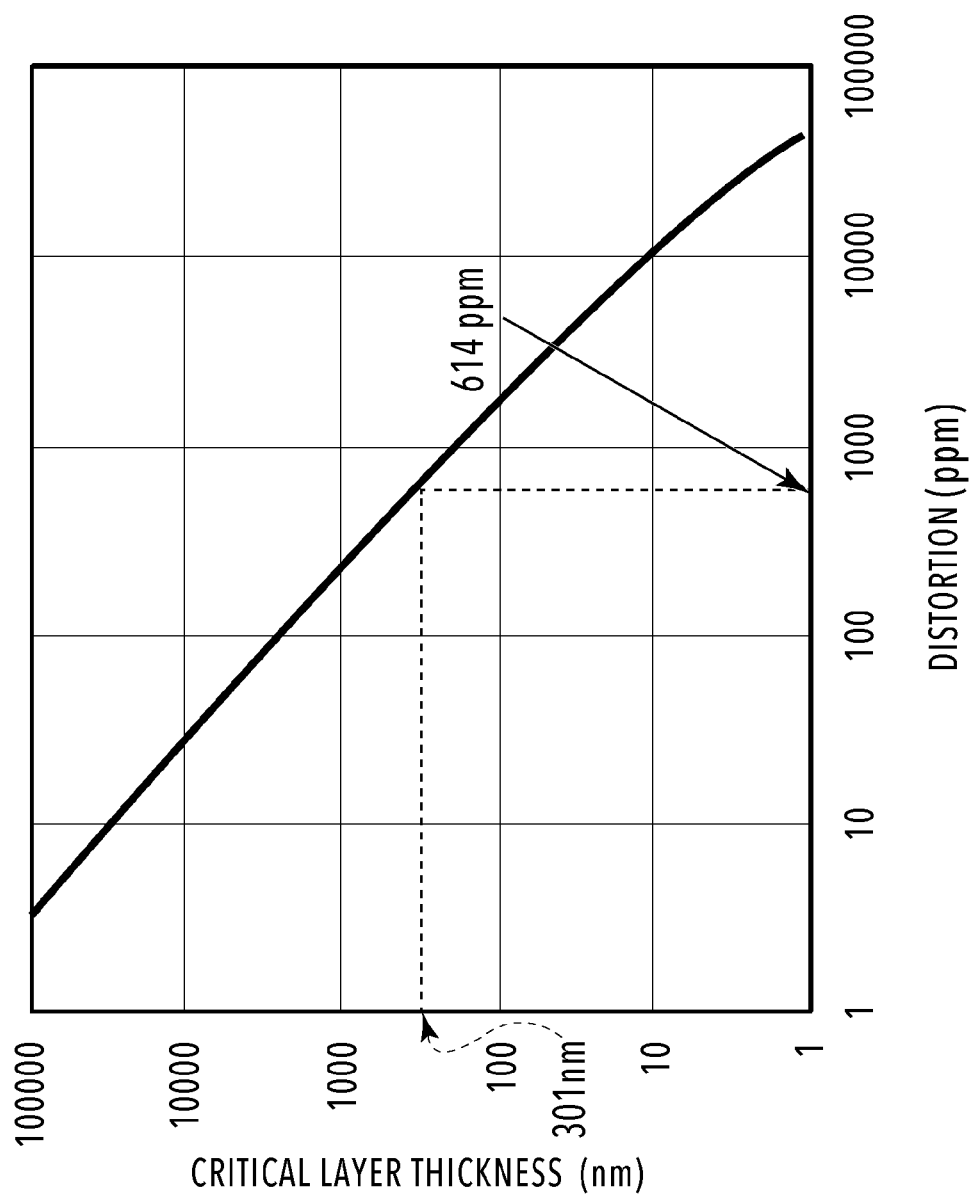
FIG. 10 is a diagram showing a relationship between strain and a critical film thickness based on Mathews' critical film thickness model.

FIG. 10 shows the relationship between distortion (horizontal axis, DISTORTION) and critical film thickness (vertical axis, CRITICAL LAYER THICKNESS) based on Mathews' critical layer thickness model for this consideration.

In the structure of Example 1, the average thermal expansion coefficient of the core layer including the active layer 1 is about 4.6 ppm/° C., which is approximately equal to that of InP, and the thermal expansion coefficient of the SiC substrate 4 constituting the lower cladding layer and the substrate is also 4.3 ppm/° C. (in the direction perpendicular to the c-axis) and is approximately the same. Assuming that the temperature rise in the manufacturing process is dT, as the thickness of the core layer is 301 nm, and the amount of strain allowed to cause no dislocation or defects in the semiconductor optical device is about 614 ppm with reference to FIG. 10, the allowable temperature rising range dT in the manufacturing process is approximately 2030° C.

The temperature rise that occurs during the semiconductor manufacturing process is caused in, for example, defect recovery annealing after ion implantation. According to NPL 4, for example, the temperature at this time is about 850° C., which falls within the aforementioned allowable temperature range.

Assuming that the allowable temperature range is about 850° C. disclosed in NPL 4, the heat-originated distortion should be 614 ppm or less in a case of using a combination of materials other than InP and SiC of this Example as the substrate and cladding materials. Therefore, the difference in thermal expansion coefficient should be approximately 0.72 ppm/K or less.

On the other hand, in the structure of the comparative example of FIG. 4, since the thermal expansion coefficient of Si is 2.6 ppm/K, the allowable temperature rise dT is at most about 250° C., and does not fit for many semiconductor manufacturing processes including defect recovery annealing.

Accordingly, the present invention is considerably advantageous even in terms of temperature rise in the manufacturing process over the comparative example, and also reduces the limitations of the applicable manufacturing processes.

Example 2

Figure 11:
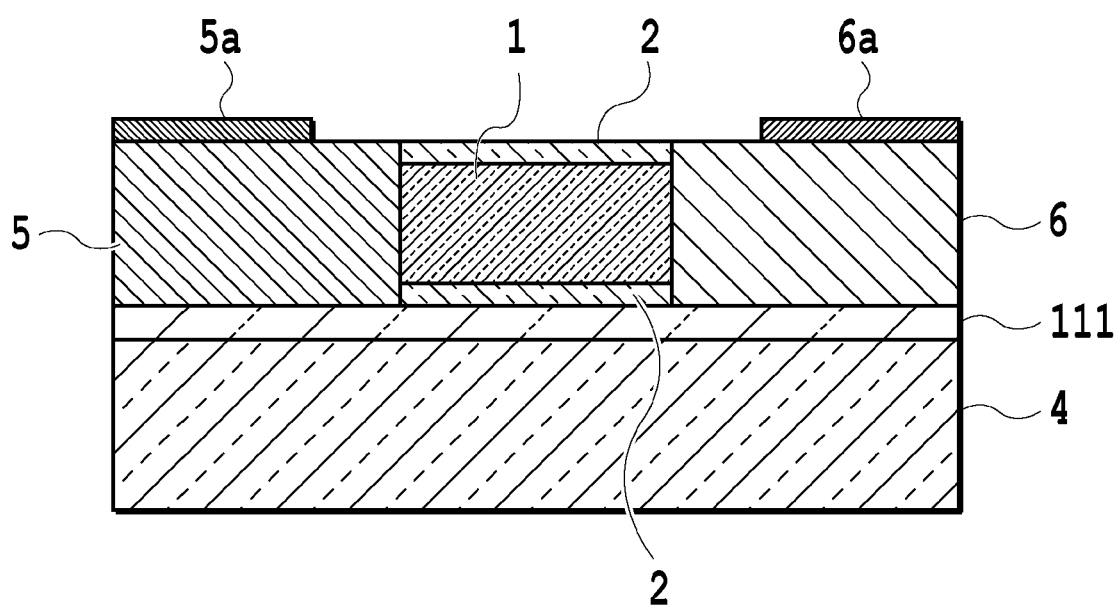
FIG. 11 is a cross-sectional structural diagram of a semiconductor optical device of Example 2 of the present invention.

The structure of Example 2 of the present invention shown in FIG. 11 differs from that of Example 1 in that the lower cladding (third cladding layer) having a two-layer structure including the SiC substrate 4 and a $SiO_2$ layer 111 is provided by forming the $SiO_2$ layer 111 which is a thin insulating film between the upper layer including the active layer 1, the optical semiconductor layers 2 and the p-type and n-type semiconductor cladding layers 5, 6, and the SiC substrate 4. An insulating film such as the $SiO_2$ layer 111 is considered important in order to suppress void formation at the bonding interface in certain substrate bonding methods.

This structure of Example 2 shown in FIG. 11 has the two-layer structure in which the lower cladding (third cladding layer) is made of two different materials. One of the two types of materials constituting the third cladding layer is a semiconductor having a large thermal conductivity (SiC being a compound semiconductor), and the other is an insulating material ($SiO_2$) having a small refractive index and a large band gap.

In the present Example 2, the structure of FIG. 4 is also examined in comparison therewith as a comparative example.

In the structure of Example 2 shown in FIG. 11, the position of the insulating material ($SiO_2$) layer 111 corresponds to the same position as the $SiO_2$ layer 42 of the comparative example of FIG. 4, but the underlying cladding layer 4 is SiC, not Si, in Example 2. For this reason, Example 2 is excellent over the comparative example not only in the heat dissipation but also in the light confinement because the refractive index of SiC is lower than that of Si. As a result, in Example 2, the insulating material ($SiO_2$) layer 111 can be made thinner than that in the comparative example in which the light confinement function should rely only on the $SiO_2$ layer 42, so that the heat dissipation can be made larger than that in the comparative example.

Figure 12:
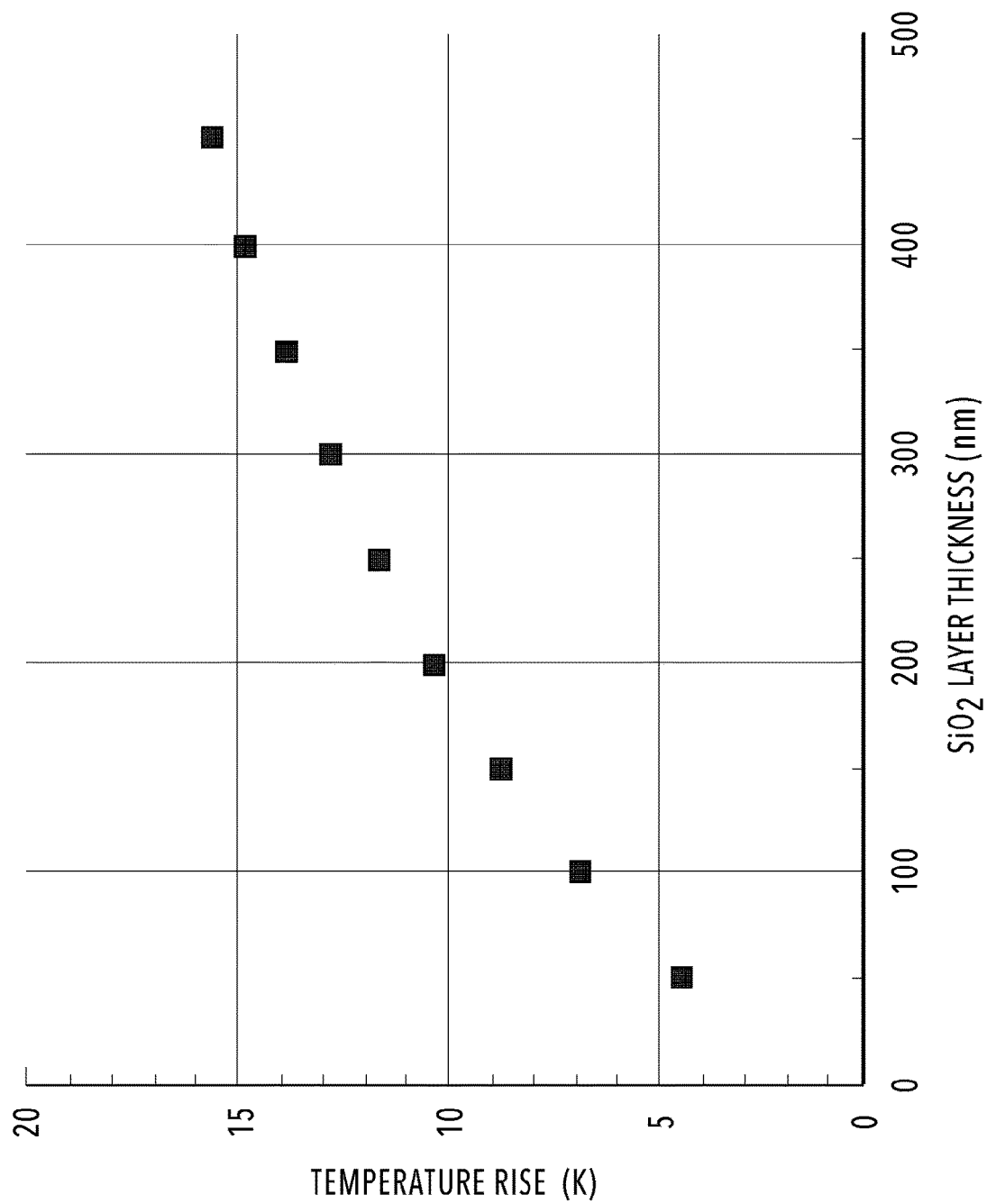
FIG. 12 is a diagram showing a temperature rise at a time of injecting current of 13 mA as a function of the thickness of a $SiO_2$ film in Example 2 of the present invention.

FIG. 12 is a diagram showing the temperature rise in Example 2, in comparison with, for example, the comparative example of FIG. 4, at the time of injecting current of 13 mA as done for the comparative example as shown in FIG. 7, as a function of the film thickness of the $SiO_2$ layer 111.

As shown in FIG. 7, the temperature rise of the comparative example fabricated on the Si substrate 41 with the injection current of 13 mA is about 15 degrees. Therefore, as apparent from FIG. 12, in Example 2, given that the film thickness of the $SiO_2$ layer 111 is 400 nm (0.4 μm) or less, there is an effect such that the temperature rise can be made 15 degrees or less, and the injection current can be made larger than 13 mA accordingly.

Figure 13:
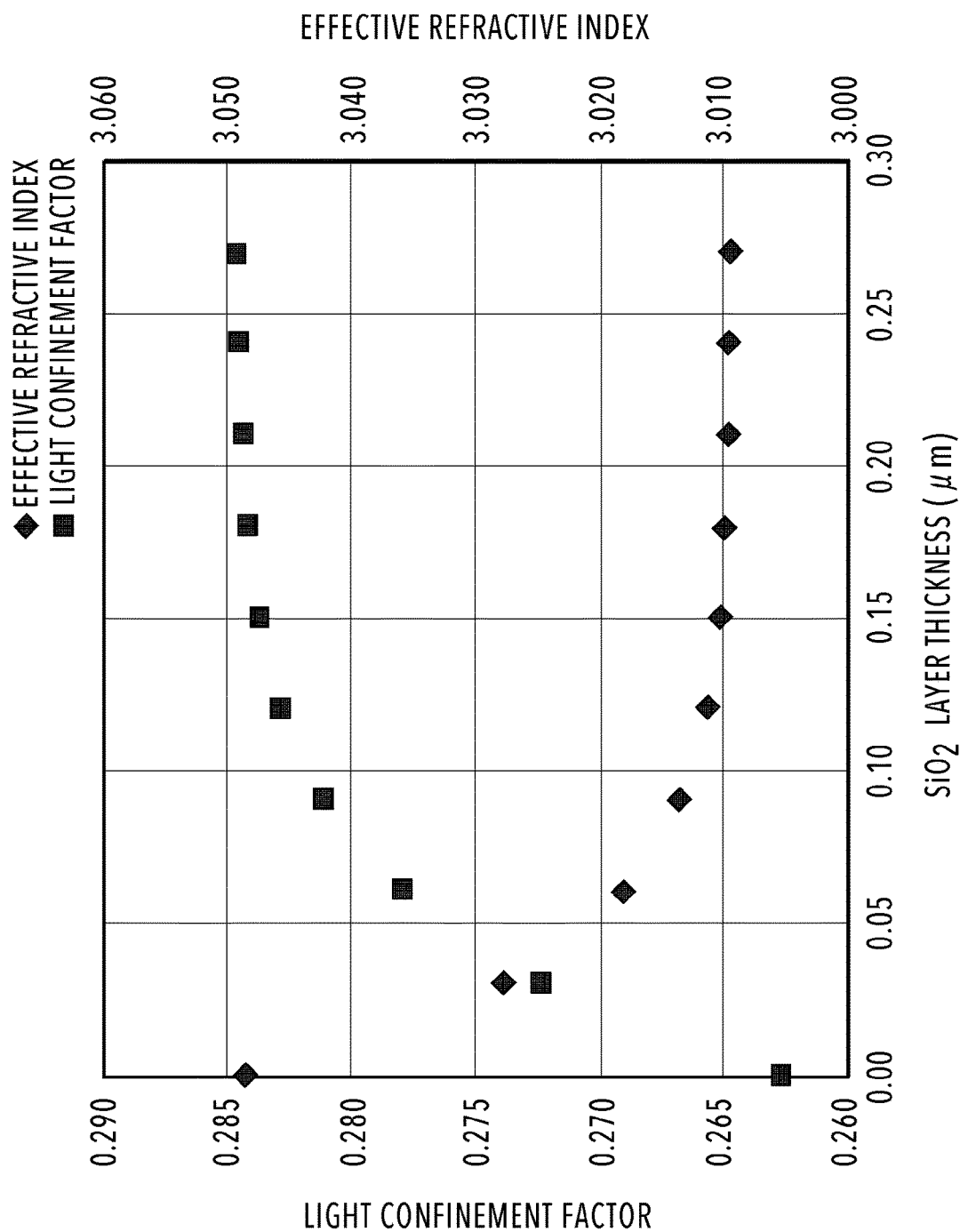
FIG. 13 is a diagram showing a relationship among the thickness of a $SiO_2$ film, a light confinement factor and an effective refractive index in Example 2 of the present invention.

Further, as shown in FIG. 13, in Example 2, the values of the light confinement factor and the effective refractive index, as calculated as a function of the $SiO_2$ film thickness, hardly vary in a case where the film thickness is equal to or greater than about 0.2 μm (=200 nm). This means that in a case where the film thickness of $SiO_2$ is 0.2 μm or less, the underlying SiC substrate 4 has an effect of a cladding material that contributes to light confinement. As described above, it is desirable in Example 2 that the film thickness of the $SiO_2$ layer 111, which is an insulating layer, is specified to be such an extent (0.4 μm or less, preferably 0.2 μm or less) that the light is confined in the core but the heat radiation effect is obtained.

Example 3

Figure 14:
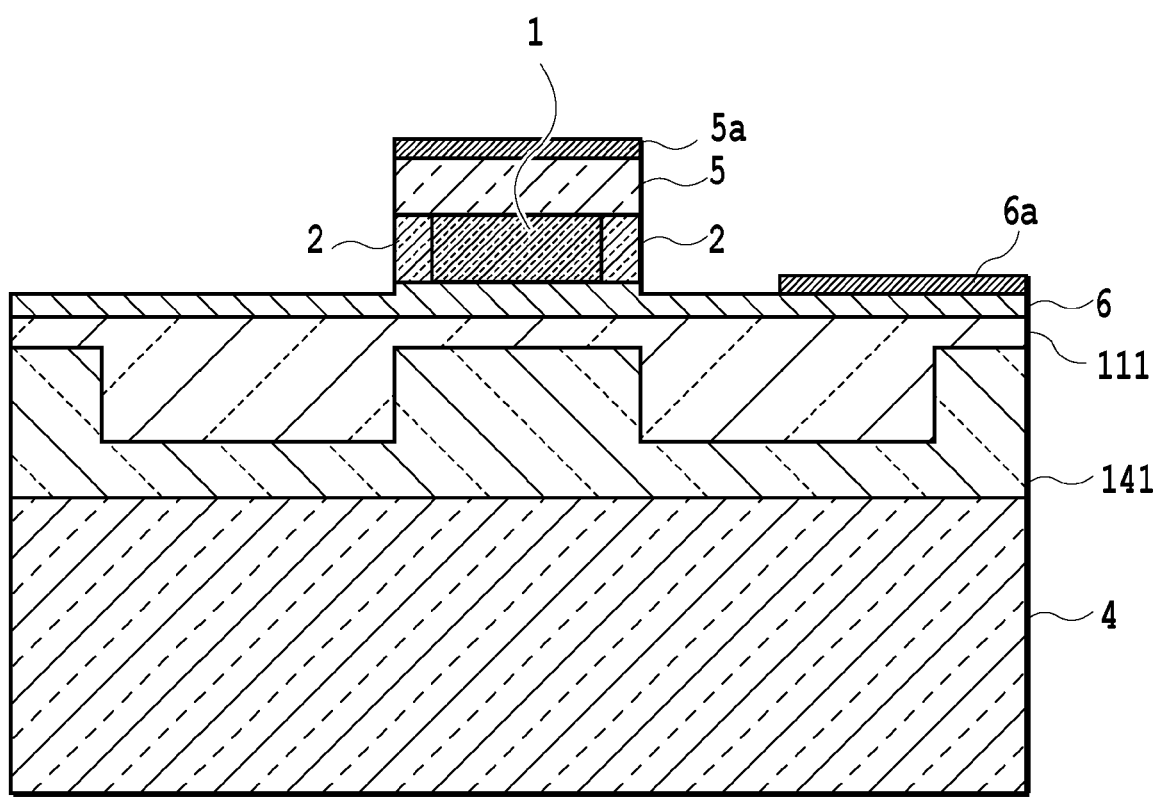
FIG. 14 is a cross-sectional structural diagram of a semiconductor optical device of Example 3 of the present invention.
Figure 15:
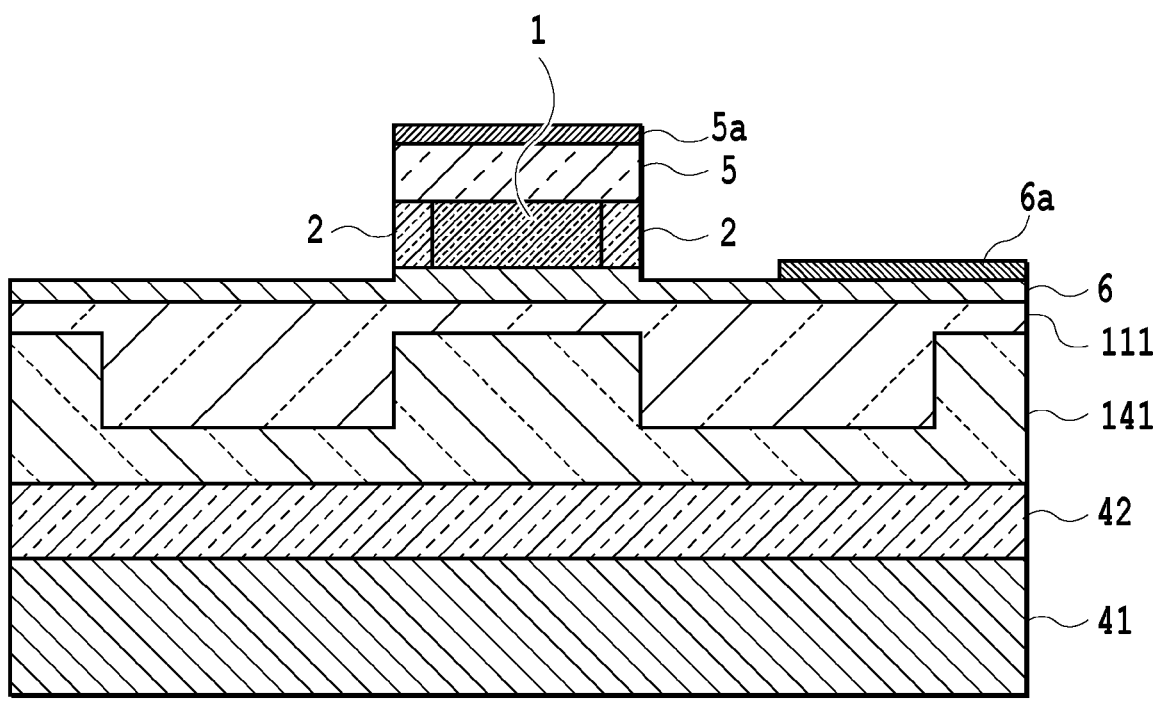
FIG. 15 is a cross-sectional structural diagram of a semiconductor optical device examined as Comparative Example 2.

FIG. 14 is a cross-sectional structural view of a semiconductor optical device according to Example 3 of the present invention. FIG. 15 is a cross-sectional structural view of a conventionally used semiconductor optical device shown as Comparative Example 2 in comparison with Example 3.

As shown in FIG. 14, the structure of Example 3 has a first feature such that the upper structure includes a p-type semiconductor layer 5 (first cladding layer) and an n-type semiconductor layer 6 (second cladding layer) which are formed so as to vertically sandwich the multiple quantum well active layer 1 and the optical semiconductor layer 2 to be the first core layer in the thicknesswise direction of the substrate.

Furthermore, Example 3 has a second feature such that the lower third cladding layer is formed to have a two-layer structure including the $SiO_2$ layer 111 to be the insulating layer and the SiC substrate 4 which serves as the cladding layer and the supporting substrate as in Example 2 (FIG. 11), and has a Si rib waveguide 141 as an optical waveguide core layer (second core layer) in the third cladding layer (between the layers of the two-layer structure).

By the structure according to the first feature of Example 3 of FIG. 14, the direction of the injection current to the first core layer including the multiple quantum well active layer 1 can be set to a direction substantially perpendicular to the surface of the third cladding layer.

By the structure according to the second feature of Example 3, a Si rib waveguide 141 serving as the second core layer (optical waveguide core layer) can be provided in the lower cladding layer (third cladding layer), in addition to the multiple quantum well active layer 1 serving as the first core layer, so that the first core layer and the second core layer can be optically coupled together.

Such optical coupling makes it possible to provide a semiconductor optical device having functions such as light amplification and light modulation with respect to light passing through the second core layer (optical waveguide core layer).

In order to realize the second feature in which the first core layer and the second core layer are optically coupled, it is not essentially necessary to provide the first feature such that the first core layer, the first cladding layer, and the second cladding layer are stacked and arranged in a direction substantially perpendicular to the surface of the third cladding layer. That is, even in the case where the second core layer is provided in the third cladding layer, the first core layer may be sandwiched on the substrate surface by the first cladding layer and the second cladding layer and disposed along the surface of the third cladding layer as in Examples 1 and 2 or Example 4 to be described later. In this case, the direction of the injection current to the first core layer is substantially parallel to the surface of the third cladding layer.

In the structure of Comparative Example 2 shown in FIG. 15, the $SiO_2$ cladding layer 42 is used under the Si rib waveguide 141, and the Si layer 41 is used as the supporting substrate. Example 3 shown in FIG. 14 is advantageous in that in addition to the advantages described with respect to Example 2, the number of the $SiO_2$ layers which become a barrier to heat radiation is smaller by one than that in Comparative Example 2.

Figure 16:
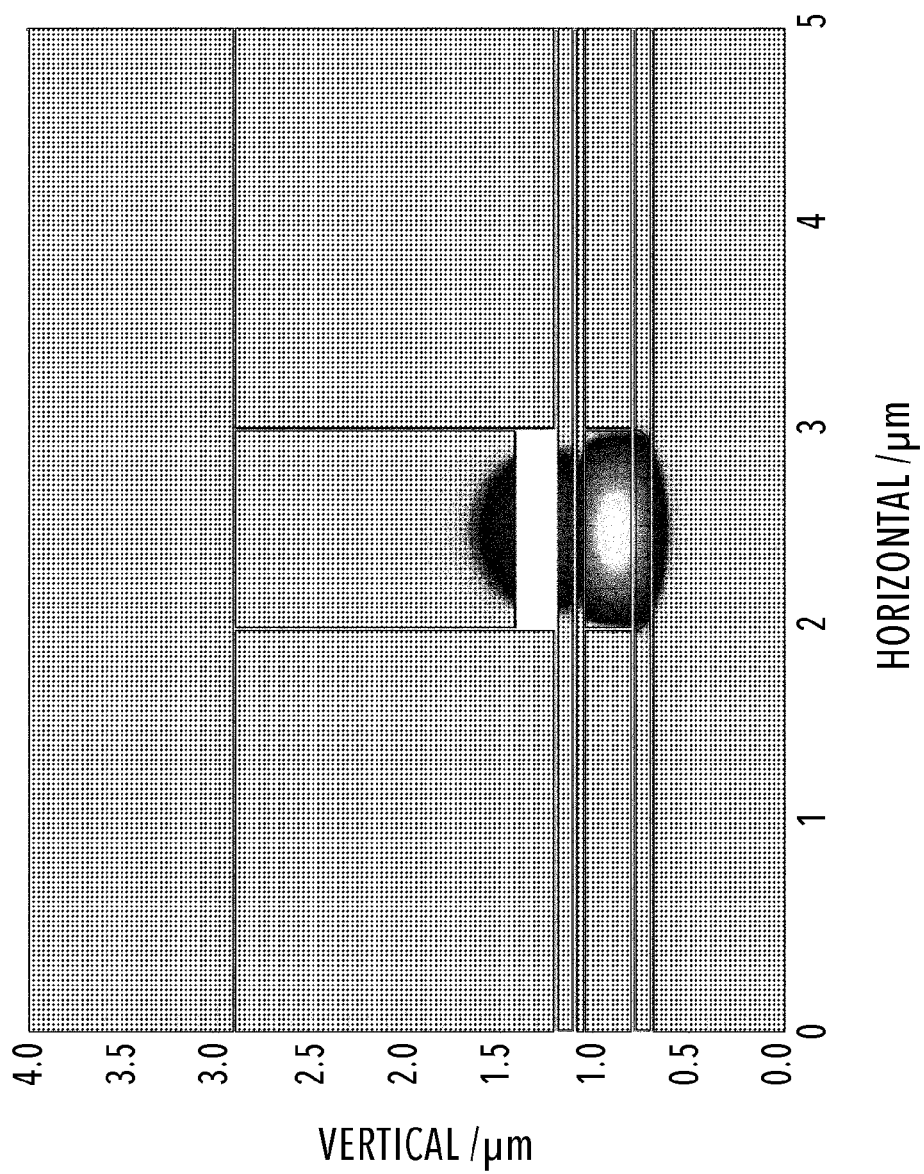
FIG. 16 is a diagram showing a waveguide mode calculated in Example 3 of the present invention.

FIG. 16 is a diagram showing the light intensity in the cross section of the device obtained by calculating the waveguide mode for light with an operating wavelength of 1.31 μm in the structure of Example 3 of FIG. 14. As apparent from FIG. 16, 72% of the total light is confined in the Si rib waveguide core layer 141. At this time, it is possible to confirm that the light intensity of a part of the waveguide mode leaks into the SiC layer 4, and the SiC layer 4 functions as a cladding layer.

Figure 17:
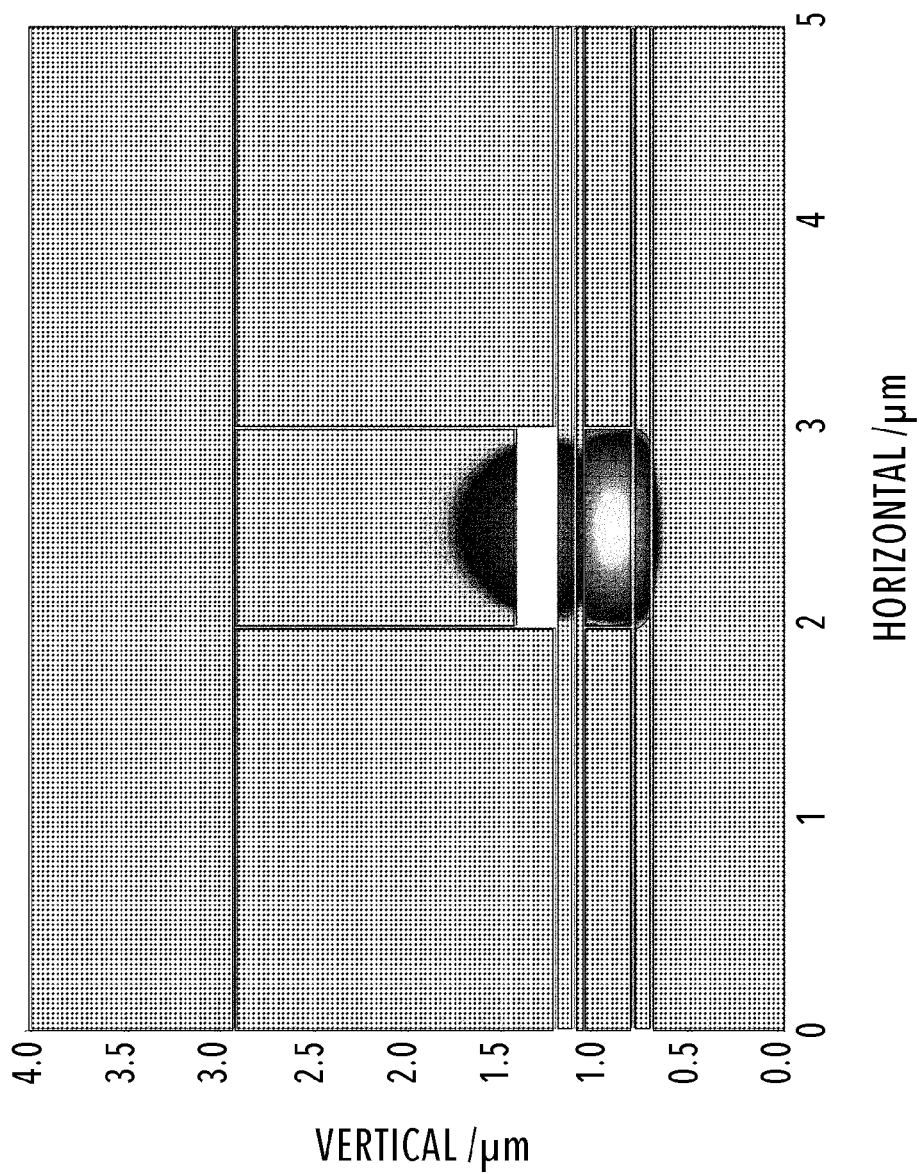
FIG. 17 is a diagram showing a waveguide mode calculated in Comparative Example 2.

FIG. 17 is a diagram showing the light intensity in the cross section of the device by similarly calculating the waveguide mode of Comparative Example 2 shown in FIG. 15. It can be seen that Comparative Example 2 also has the same waveguide mode as the present invention (light confinement in the core layer: 63%, the difference in numerical value being due to the symmetry of the refractive index above and under the core layer). Therefore, it can be said that the structure of the semiconductor optical device according to Example 3 of the present invention in FIG. 14 can achieve light confinement without any loss as compared with the case of Comparative Example 2 in which the cladding layer is formed by an insulating film with a poor thermal conductivity represented by the $SiO_2$ layer 42 in FIG. 15. This achievement of light confinement is due to optically coupling of the second core layer inserted in the third cladding layer to the first core layer in Example 3.

Further, in order to also verify the heat radiation property, a case where a 50 mW/μm² heat source was disposed in the p-InP layer 5 in the cross-sectional structures of Example 3 of FIG. 14 and Comparative Example 2 of FIG. 15 was studied. Then, it is found that the temperature rise of about 16° C. occurs in the structure of conventional Comparative Example 2, whereas the temperature rise is reduced to about 9° C. in the structure according to Example 3 of the present invention. It is also shown that Example 3 is superior in heat dissipation over Comparative Example 2.

Example 4

Figure 18:
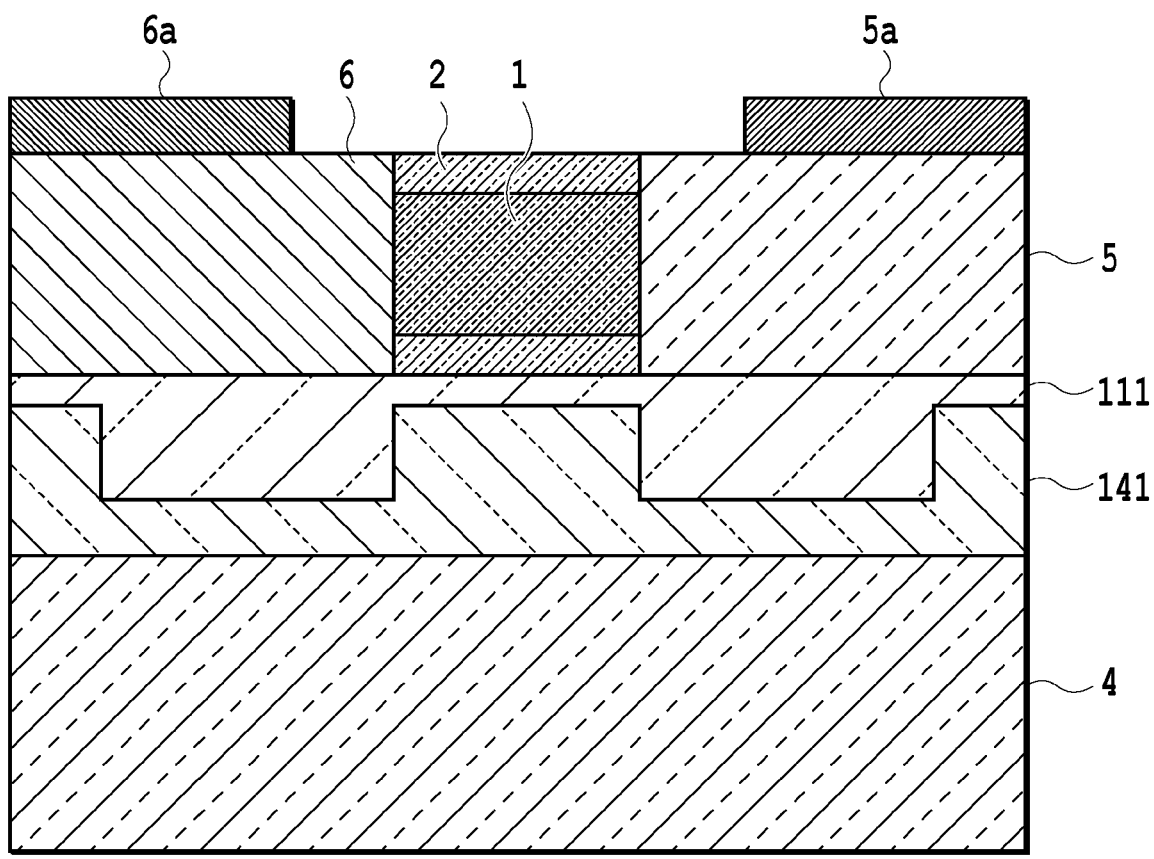
FIG. 18 is a cross-sectional structural diagram of a semiconductor optical device of Example 4 of the present invention.

FIG. 18 shows a cross-sectional structural view of Example 4 of the present invention. Example 4, like Example 3, has the second core layer, which is optically coupled to the first core layer, in the third cladding layer, but differs from Example 3 in that the direction of the injection current to the first core layer is a direction substantially parallel to the surface of the third cladding layer.

Example 4 shown in FIG. 18 includes a first quantum well active layer 1 and an i-InP layer 2, which serve as a first core layer, and a p-type semiconductor layer 5 (first cladding layer) and an n-type semiconductor layer 6 (second cladding layer), which are formed to horizontally sandwich the first core layer. An optical waveguide core layer 141 (second core layer) is provided in a lower third cladding layer via a $SiO_2$ layer 111 serving as an insulating layer, thereby forming a Si rib waveguide.

Based on the present invention, in Example 4, the SiC substrate 4 is also adopted under the optical waveguide core layer as a part of the cladding layer and the supporting substrate (third cladding layer).

In Example 4, as in Example 3, the first core layer and the second core layer are optically coupled, so that a part of the waveguide mode propagates through the second core layer. In a case where the first core layer, the second core layer, and the insulating layer 111 similar to those of Example 3 are used, the light confinement factor becomes approximately the same value as the value provided in Example 3. The same is true of the heat dissipation.

One of the differences between Example 4 and Example 3 is that the direction of the current injection to the multiple quantum well active layer 1 to be the first core layer is changed to a direction parallel to the substrate surface of the third cladding layer. The direction in which the current is injected does not particularly affect the implementation of the present invention.

The contact layer and electrodes 5a and 6a are formed on the first cladding layer 5 and the second cladding layer 6 apart from the core layer without being in contact with the first core layer. This is to suppress absorption of light propagating through the first core layer and form a low loss semiconductor optical device. However, the positions and shapes of the contact layer and the electrodes are not limited to those of the illustrated structure.

Example 5

Figure 19:
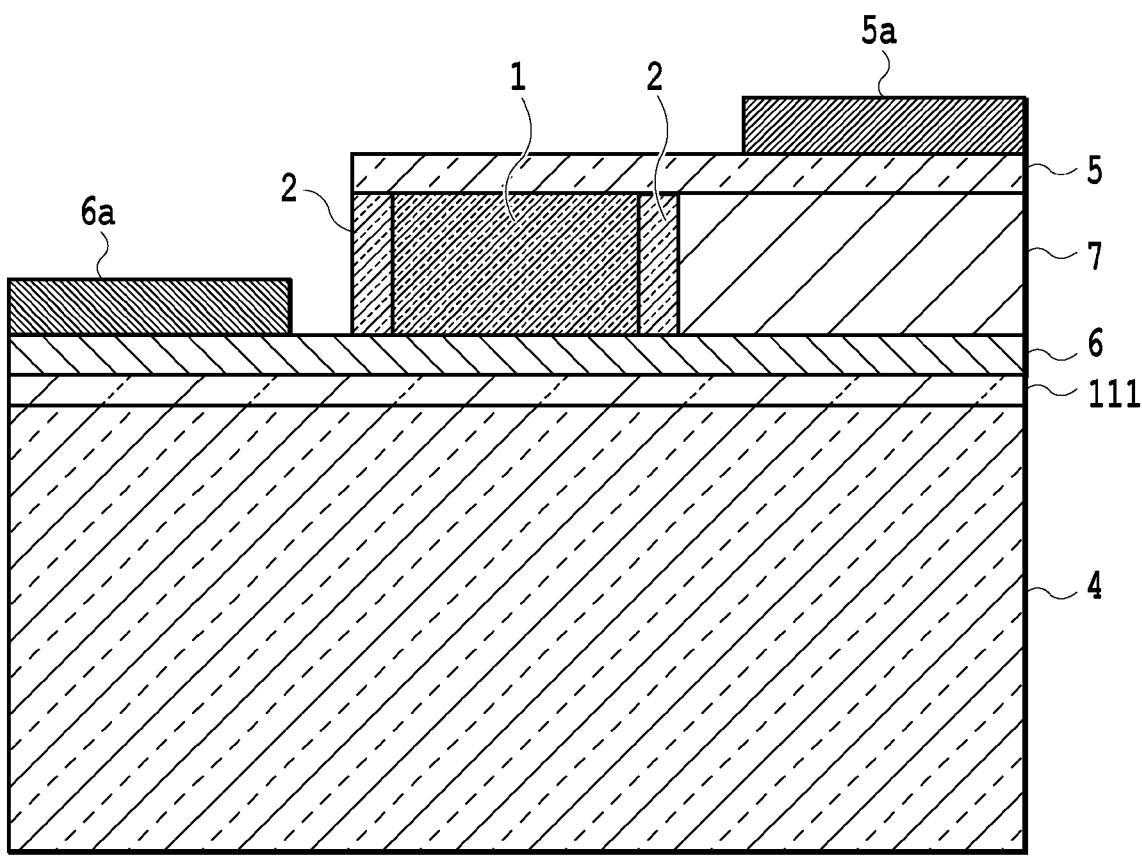
FIG. 19 is a cross-sectional structural diagram of a semiconductor optical device of Example 5 of the present invention.

FIG. 19 shows a cross-sectional structural view of Example 5 of the present invention. In Example 5, the direction of the injection current to the first core layer is a direction substantially perpendicular to the substrate surface as in Example 3 of FIG. 14, but the third cladding layer has a two-layer structure similar to that of Example 2 of FIG. 11, which does not have the second core layer.

Example 5 in FIG. 19 has, in the upper structure, a p-type semiconductor layer 5 (first cladding layer) and an n-type semiconductor layer 6 (second cladding layer) which are formed so as to vertically sandwich the multiple quantum well active layer 1 serving as the first core layer and the optical semiconductor layer 2. The lower third cladding layer has a two-layer structure with the SiC substrate 4 adopted as the cladding layer and the supporting substrate via the SiO$_2$ layer 111 serving as an insulating layer.

One of the differences between Example 5 and Example 2 is that the direction of the current injection to the multiple quantum well active layer 1 to be the first core layer is changed to a direction perpendicular to the substrate surface. The direction in which the current is injected does not particularly affect the implementation of the present invention.

In Example 5, in a case where the first core layer and the insulating layer 111 similar to those of Example 2 are used, the light confinement factor becomes approximately the same value as the value provided in Example 2. The same is true of the heat dissipation.

The contact layer and electrodes 5a and 6a are not located directly on and directly under the first core layer 1, 2, are disposed shifted from each other horizontally in the figure in an inward direction of the substrate surface, and are formed on the first cladding layer 5 and the second cladding layer 6 apart from the core layer. This is to suppress absorption of light propagating through the first core layer and form a low loss semiconductor optical device. However, the positions and shapes of the contact layer and the electrodes are not limited to those of the illustrated structure.

As a characteristic structure in Example 5, a supporting structure layer 7 is disposed under that portion of the first cladding layer 5 which corresponds to the contact layer and electrode 5a. This supporting structure layer 7 can be made of any one of an insulating material such as SiO$_2$, a high-resistance semiconductor such as Fe-doped InP, or a semiconductor such as i-InP. The supporting structure layer 7 is formed to have the same height as the active layer 1 and the optical semiconductor layer 2, so that the contact layer and electrode 5a on the first cladding layer 5 can be disposed apart from the core layer.

INDUSTRIAL APPLICABILITY

As described above, according to the semiconductor optical device of the present invention, it is possible to achieve both of high optical confinement and high thermal conductivity, and it is possible to implement a semiconductor optical device capable of efficiently injecting current or applying an electric field advantageously even in the manufacturing process.

REFERENCE SIGNS LIST

1 Semiconductor active layer (active region)
2 Optical semiconductor layer (i-InP layer)
3 Upper cladding layer
4 Lower cladding layer (third cladding layer, SiC substrate)
5 P-type semiconductor layer (first cladding layer)
6 N-type semiconductor layer (second cladding layer)
5a, 6a Contact layer and electrodes
7 supporting structure layer
41 Si layer (substrate)
42, 111 SiO$_2$ layer
141 Si rib waveguide (optical waveguide core layer)

The invention claimed is:

1. A semiconductor optical device comprising:
   a first core layer including an active region made of a compound semiconductor;
   a first cladding layer made of a p-type semiconductor and a second cladding layer made of an n-type semiconductor, the first cladding layer and the second cladding layer sandwiching the first core layer; and
   a third cladding layer disposed under the first core layer, the first cladding layer, and the second cladding layer,
   wherein
   the third cladding layer is made of a material having:
   a thermal conductivity greater than that of any of the first core layer, the first cladding layer, and the second cladding layer;
   a refractive index smaller than that of any of the first core layer, the first cladding layer, and the second cladding layer;
   a band gap larger than that of any of the first core layer, the first cladding layer, and the second cladding layer; and
   a thickness t of the first core layer satisfies the following relationship:

$$t < \frac{3}{2\pi} \frac{\lambda}{\sqrt{n_{core}^2 - n_{clad}^2}}$$

where an operating wavelength of lights is λ, an averager refractive index of the first core layer is n.

2. The semiconductor optical device according to claim 1, wherein the third cladding layer is made of one type of material.

3. The semiconductor optical device according to claim 1, wherein
   the material forming the third cladding layer includes at least one of SiC (silicon carbide), GaN (gallium nitride), C (diamond), AlN (aluminum nitride), BN (boron nitride).

4. The semiconductor optical device according to claim 1, wherein
   the third cladding layer is made of at least two different kinds of materials.

5. The semiconductor optical device according to claim 4, wherein
   one of the two types of materials forming the third cladding layer is a semiconductor having a large thermal conductivity, and another of the materials is an insulating material having a small refractive index and a large band gap.

6. The semiconductor optical device according to claim 5, wherein a thickness of the layer of the insulating material is defined to such an extent that light is confined in a core, but a heat radiation effect is obtained.

7. The semiconductor optical device according to claim 1, wherein
a second core layer is inserted in the third cladding layer, and the first core layer and the second core layer are optically coupled.

8. The semiconductor optical device according to claim 1, wherein
the first core layer is sandwiched between the first cladding layer and the second cladding layer and is disposed along a surface of the third cladding layer, and
a direction of an injection current to the first core layer is substantially parallel to the surface of the third cladding layer.

9. The semiconductor optical device according to claim 1, wherein
the first core layer is sandwiched between the first cladding layer and the second cladding layer and is disposed perpendicular to a surface of the third cladding layer, and
a direction of an injection current to the first core layer is perpendicular to the surface of the third cladding layer.

* * * * *